United States Patent
Li et al.

(10) Patent No.: US 12,381,114 B2
(45) Date of Patent: Aug. 5, 2025

(54) PACKAGE STRUCTURE WITH FAN-OUT FEATURE

(71) Applicant: TAIWAN SEMICONDUCTOR MANUFACTURING COMPANY, LTD., Hsinchu (TW)

(72) Inventors: Ling-Wei Li, Hsinchu (TW); Jung-Hua Chang, Hsinchu (TW); Cheng-Lin Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/360,581

(22) Filed: Jul. 27, 2023

(65) Prior Publication Data

US 2023/0369115 A1 Nov. 16, 2023

Related U.S. Application Data

(63) Continuation of application No. 16/893,939, filed on Jun. 5, 2020, now Pat. No. 11,784,091.
(Continued)

(51) Int. Cl.
*H01L 21/768* (2006.01)
*H01L 23/00* (2006.01)
(Continued)

(52) U.S. Cl.
CPC .. *H01L 21/76885* (2013.01); *H01L 21/76837* (2013.01); *H01L 21/76877* (2013.01);
(Continued)

(58) Field of Classification Search
CPC ........ H01L 21/76885; H01L 21/76837; H01L 21/76877; H01L 23/5386; H01L 24/11;
(Continued)

(56) References Cited

U.S. PATENT DOCUMENTS 9,000,584 B2   4/2015   Lin et al.
9,048,222 B2   6/2015   Hung et al.
(Continued)

*Primary Examiner* — Phat X Cao
(74) *Attorney, Agent, or Firm* — Birch, Stewart, Kolasch & Birch, LLP

(57) ABSTRACT

A package structure includes a first semiconductor die having a first conductive pad and a second semiconductor die having a second conductive pad. The package structure also includes a conductive structure and a third semiconductor die. The third semiconductor die extends across a portions of the first semiconductor die and the second semiconductor die. A third conductive pad and a fourth conductive pad of the third semiconductor die are aligned with the first conductive pad and the second conductive pad, respectively. The package structure further includes a protective layer surrounding the conductive structure and the third semiconductor die and an insulating layer extending across an interface between the protective layer and the conductive structure. The package structure includes a conductive layer electrically connected to the conductive structure. The conductive layer has a first portion spaced from the conductive structure and a second portion directly above the conductive structure.

20 Claims, 14 Drawing Sheets

Related U.S. Application Data

(60) Provisional application No. 62/894,336, filed on Aug. 30, 2019.

(51) Int. Cl.
*H01L 23/522* (2006.01)
*H01L 23/528* (2006.01)
*H01L 23/538* (2006.01)
*H01L 25/00* (2006.01)
*H01L 25/065* (2023.01)

(52) U.S. Cl.
CPC ...... *H01L 23/5226* (2013.01); *H01L 23/5283* (2013.01); *H01L 23/5386* (2013.01); *H01L 24/11* (2013.01); *H01L 24/13* (2013.01); *H01L 25/0655* (2013.01); *H01L 25/50* (2013.01)

(58) Field of Classification Search
CPC ........... H01L 23/3128; H01L 23/49822; H01L 23/5226; H01L 25/0655
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,784,091 B2 * | 10/2023 | Li ................... H01L 21/76877 257/773 |
| 2011/0187002 A1 | 8/2011 | Kishii et al. |
| 2013/0213816 A1 | 8/2013 | Chiu et al. |
| 2015/0061123 A1 | 3/2015 | Lin et al. |
| 2017/0062391 A1 | 3/2017 | Chen et al. |
| 2017/0213763 A1 | 7/2017 | Matsumoto |
| 2017/0317029 A1 | 11/2017 | Hsieh et al. |
| 2018/0102311 A1 * | 4/2018 | Shih ................. H01L 23/5381 |
| 2018/0226349 A1 * | 8/2018 | Yu ..................... H01L 21/568 |
| 2018/0294213 A1 * | 10/2018 | Aoki .................. H01L 23/481 |
| 2018/0350745 A1 | 12/2018 | Hsieh et al. |
| 2019/0043792 A1 * | 2/2019 | Weerasekera ..... H01L 25/0652 |

* cited by examiner

PACKAGE STRUCTURE WITH FAN-OUT FEATURE

PRIORITY CLAIM AND CROSS-REFERENCE

This Application is a Continuation of U.S. application Ser. No. 16/893,939, filed on Jun. 5, 2020, which claims the benefit of U.S. Provisional Application No. 62/894,336, filed on Aug. 30, 2019, the entirety of which are incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
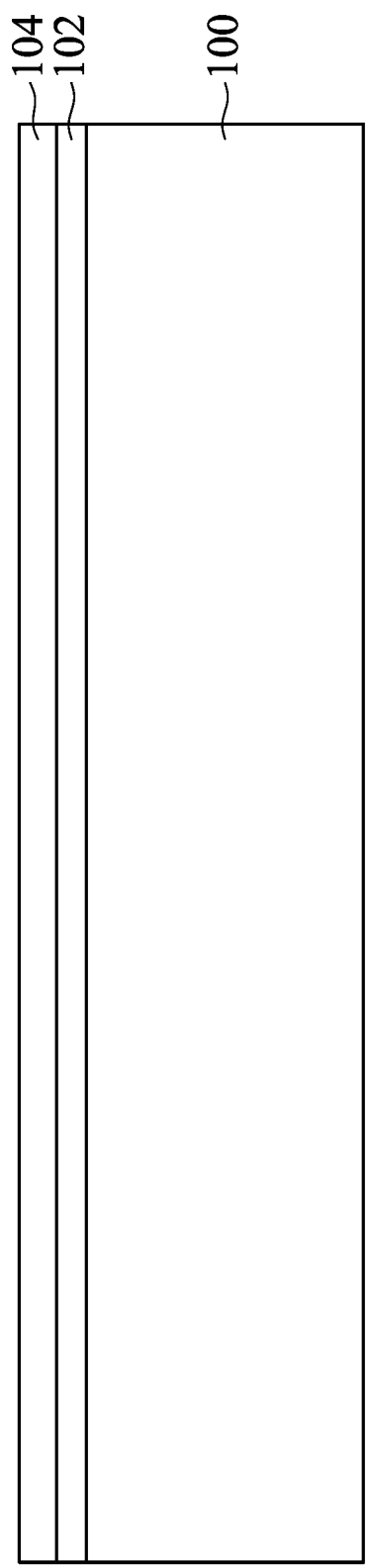
FIGS. 1A-1I are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the package structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1I are cross-sectional views of various stages of a process for forming a package structure, in accordance with some embodiments. As shown in FIG. 1A, a carrier substrate 100 is provided or received. In some embodiments, the carrier substrate 100 is used as a temporary support substrate that will be removed later. The carrier substrate 100 may be made of or include a semiconductor material, a ceramic material, a polymer material, a metal material, one or more other suitable materials, or a combination thereof. In some embodiments, the carrier substrate 100 is a glass substrate, such as a glass wafer. In some other embodiments, the carrier substrate 100 is a semiconductor substrate, such as a silicon wafer.

Afterwards, an adhesive layer 102 is formed or attached over the carrier substrate 100, as shown in FIG. 1A in accordance with some embodiments. The adhesive layer 102 may be made of or include glue, a lamination material, one or more other suitable materials, or a combination thereof. In some embodiments, the adhesive layer 102 is sensitive to an energy beam irradiation. In some embodiments, the adhesive layer 102 is a release layer that is made of or includes a light-to-heat conversion (LTHC) material. For example, a laser beam and/or an ultraviolet (UV) light may be used to irradiate the adhesive layer 102. After irradiation, the adhesive layer 102 may be easily detached from the carrier substrate 100. In some other embodiments, the adhesive layer 102 is heat-sensitive. The adhesive layer 102 may be detached using a thermal operation.

In some embodiments, the adhesive layer 102 is a single layer. However, embodiments of the disclosure are not limited thereto. Many variations and/or modifications can be made to embodiments of the disclosure. In some other embodiments, the adhesive layer 102 includes multiple sub-layers. In some embodiments, the sub-layers include a glue layer, a polymer base layer, and an LTHC layer.

Afterwards, a die-attach film (DAF) 104 is attached onto the adhesive layer 102, as shown in FIG. 1A in accordance with some embodiments. The die-attach film 104 may be made of or include one or more phenolic base materials, one or more epoxy base materials, one or more other suitable materials, or a combination thereof.

Many variations and/or modifications can be made to embodiments of the disclosure. In some other embodiments, the die-attach film 104 is not formed over or attached to the adhesive layer 102.

Figure 1B:
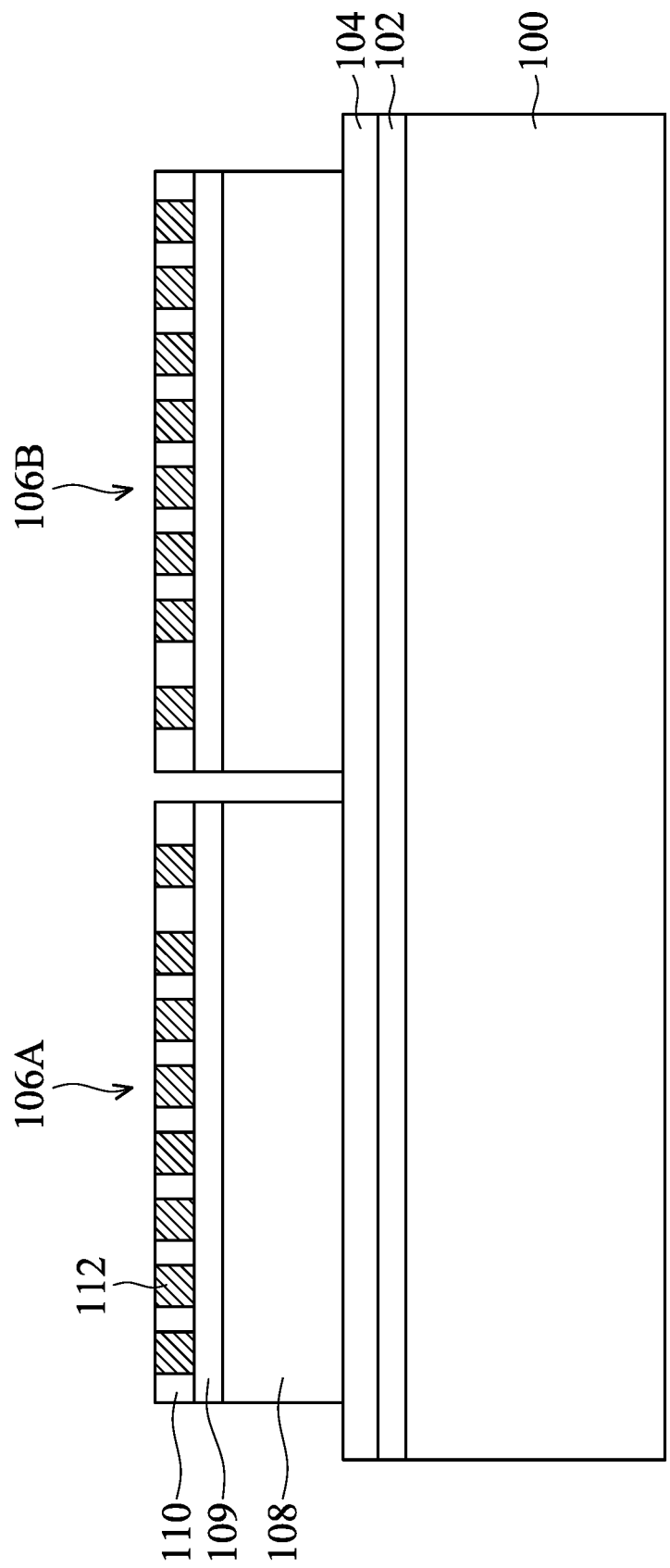

As shown in FIG. 1B, semiconductor dies 106A and 106B are disposed over the die-attach film 104, in accordance with some embodiments. In some embodiments, the semiconductor die 106A and 106B can each include a chip (e.g., a system-on-chip (SoC) chip) that includes one or more desired functions. In some embodiments, the back sides of the semiconductor dies 106A and 106B face the die-attach film 104 with the front sides of the semiconductor dies 106A and 106B facing upwards. The semiconductor dies 106A and 106B may be disposed using a pick and place operation. In some embodiments, a robot arm is used to pick up the semiconductor die 106A, and then the robot arm places the semiconductor die 106A onto the corresponding position of the die-attach film 104. Afterwards, the robot arm is used to pick up the semiconductor die 106B and place it onto the corresponding position of the die-attach film 104. In some other embodiments, two or more robot arms are used to pick and place the semiconductor dies 106A and 106B at the same time. Alternatively, in some other embodiments, the front sides of the semiconductor dies 106A and 106B face the die-attach film 104 with the back sides of the semiconductor dies 106A and 106B facing upwards.

Each of the semiconductor dies 106A and 106B may include a semiconductor substrate 108, an interconnection structure 109, conductive pads 112 at the front side of the semiconductor die, and a passivation layer 110 surrounding the conductive pads 112. In some embodiments, various device elements are formed in and/or on the semiconductor substrate 108. Examples of the various device elements include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc.), diodes, or other suitable elements.

The device elements may be interconnected to form integrated circuit devices through conductive features formed in the interconnection structure 109. The interconnection structure 109 may include multiple dielectric layers and multiple conductive features. The conductive features may include multiple conductive lines, conductive contacts, and conductive vias. The integrated circuit devices include logic devices, memory devices (e.g., static random access memories, SRAMs), radio frequency (RF) devices, input/output (I/O) devices, system-on-chip (SoC) devices, one or more other applicable types of devices, or a combination thereof. In some embodiments, the semiconductor die 106A or 106B is a system-on-chip (SoC) chip that includes multiple functions.

The conductive pads 112 may be wider portions of some of the conductive lines formed on the interconnection structure 109. The conductive pads 112 may be partially embedded in the passivation layer 110. Each of the conductive pads 112 is electrically connected to one or more device elements through some of the conductive features in the interconnection structure 109. Therefore, the device elements in and/or on the semiconductor substrate 108 may be electrically connected to other elements through the conductive pads 112.

Figure 1C:
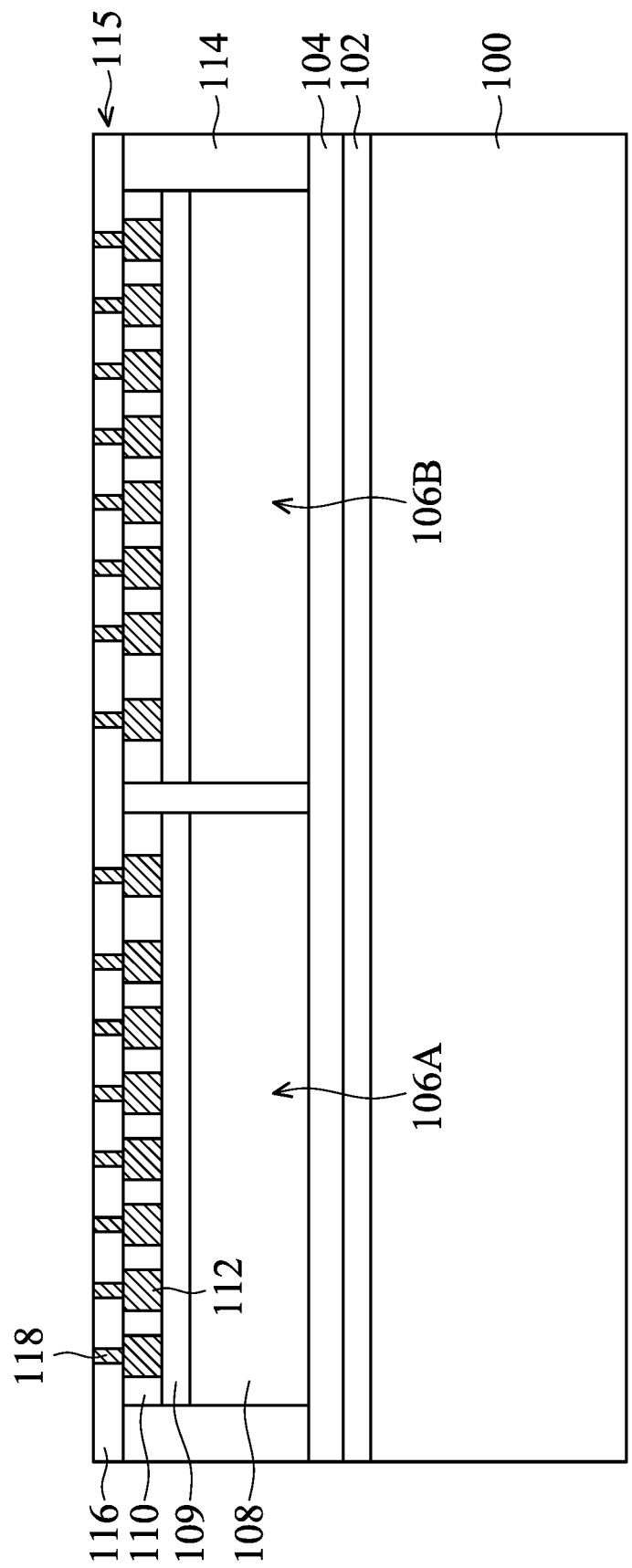

As shown in FIG. 1C, a protective layer 114 is formed over the carrier substrate 100 to surround and protect the semiconductor dies 106A and 106B, in accordance with some embodiments. A portion of the protective layer 114 may be formed between the semiconductor dies 106A and 106B. In some embodiments, the protective layer 114 is in direct contact with the semiconductor dies 106A and 106B. In some embodiments, the protective layer 114 is made of or includes an insulating material such as a molding material.

The molding material may include a polymer material, such as an epoxy-based resin with one or more fillers dispersed therein. The fillers may include insulating particles, insulating fibers, one or more other elements, or a combination thereof. For example, the fillers include silica particles, silica fibers, carbon-containing particles, carbon-containing fibers, one or more other suitable fillers, or a combination thereof.

In some embodiments, a molding material (such as a liquid molding material) is introduced or injected to cover the semiconductor dies 106A and 106B. In some embodiments, a thermal operation is then used to cure the liquid molding material and to transform it into the protective layer 114.

In some embodiments, a planarization process is used to reduce the thickness of the protective layer 114. In some embodiments, the protective layer 114 is planarized to expose the conductive pads 112 of the semiconductor dies 106A and 106B. The planarization of the protective layer 114 may be achieved using a mechanical grinding process, a chemical mechanical polishing (CMP) process, a dry polishing process, an etching process, one or more other applicable processes, or a combination thereof.

Afterwards, a redistribution structure 115 is formed over the protective layer 114 and the semiconductor dies 106A and 106B, as shown in FIG. 1C in accordance with some embodiments. The redistribution structure 115 is used for routing, which may enable the formation of a package structure with fan-out features. In some embodiments, the redistribution structure 115 extends across the interface between the semiconductor die 106A (or 106B) and the protective layer 114.

In some embodiments, the redistribution structure 115 includes one or more insulating layers 116 and multiple conductive features 118. The conductive features 118 are surrounded by the one or more insulating layers 116. The conductive features 118 may include conductive lines, conductive vias, and/or conductive pads.

The insulating layer 116 of the redistribution structure 115 may be made of or include one or more polymer materials. The polymer material(s) may include polyimide (PI), polybenzoxazole (PBO), epoxy-based resin, one or more other suitable polymer materials, or a combination thereof. In some embodiments, the polymer material is photosensitive. A photolithography process may therefore be used to form openings with desired patterns in the insulating layers. These openings may be used to contain the conductive features.

The conductive features 118 may include conductive lines providing electrical connection in horizontal directions and conductive vias providing electrical connection in vertical directions. In some embodiments, some of the conductive vias are stacked with each other. The upper conductive via is substantially aligned with the lower conductive via. In some embodiments, some of the conductive vias are staggered vias. The upper conductive via is misaligned with the lower conductive via. In some embodiments, the conductive features 118 are through vias that penetrate through the insulating layer 116. In some embodiments, each of the conductive features 118 is aligned with the corresponding conductive pad 112 thereunder.

The conductive features 118 of the redistribution structure 115 may be made of or include copper, aluminum, gold, cobalt, titanium, nickel, silver, graphene, one or more other suitable conductive materials, or a combination thereof. In some embodiments, the conductive features 118 include multiple sub-layers. For example, each of the conductive features 118 contains multiple sub-layers including Ti/Cu, Ti/Ni/Cu, Ti/Cu/Ti, Al/Ti/Ni/Ag, other suitable sub-layers, or a combination thereof.

The formation of the redistribution structure 115 may involve multiple deposition or coating processes, multiple patterning processes, and/or multiple planarization processes.

The deposition or coating processes may be used to form insulating layers and/or conductive layers. The deposition or coating processes may include a spin coating process, a spray coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a CMP process, a dry polishing process, an etching process, one or more other applicable processes, or a combination thereof.

Figure 1D:
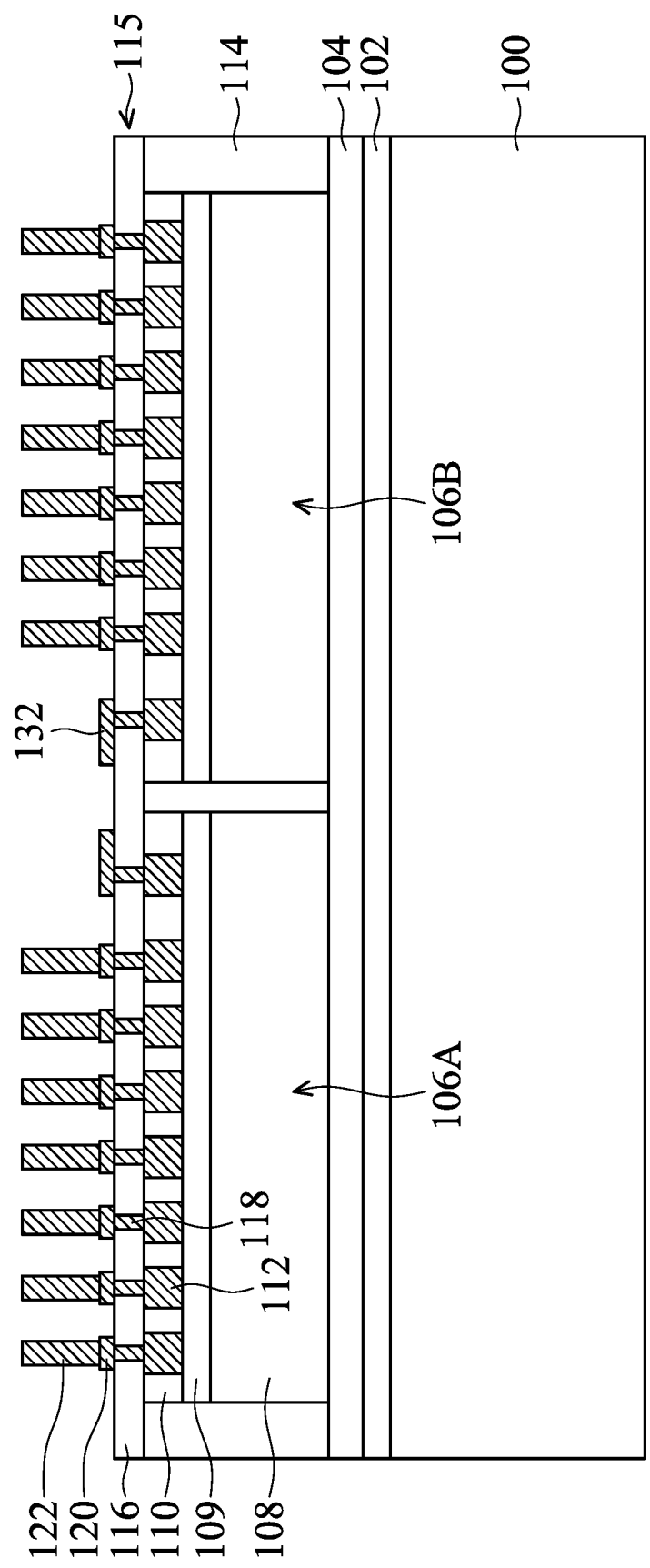

As shown in FIG. 1D, conductive pads 120 and 132 are formed over the redistribution structure 115, in accordance with some embodiments. Each of the conductive pads 120 and 132 is electrically connected to the corresponding conductive feature 118 thereunder. The conductive pads 120 may be used to hold or receive conductive features such as conductive pillars and/or conductive bumps. The conductive pads 132 may be used to hold or receive one or more semiconductor dies or other elements. In some embodiments, the conductive pads 120 and 132 function as under bump metallization (UBM) pads. The formation of the conductive pads 120 and 132 may involve one or more deposition processes and one or more patterning processes.

Afterwards, conductive structures 122 are formed over the conductive pads 120, as shown in FIG. 1D in accordance with some embodiments. In some embodiments, the conductive structures 122 are conductive pillars. The conductive structures 122 may function as through vias. In some embodiments, each of the conductive structures 122 has a substantially vertical sidewall that is substantially perpendicular to the top surface of the conductive structure 122. The conductive structures 122 may be made of or include copper, cobalt, tin, titanium, gold, one or more other suitable materials, or a combination thereof. The conductive structures 122 may be formed using an electroplating process, an electroless plating process, one or more other applicable processes, or a combination thereof.

Many variations and/or modifications can be made to embodiments of the disclosure. In some other embodiments, the conductive structures 122 are picked and placed onto the conductive pads 120. In some embodiments, solder elements or solder materials (such as tin-containing solder materials) are used to affix the conductive structures 122 on the conductive pads 120. In some embodiments, a mask element is used to assist in the placing of the conductive structures 122.

Figure 1E:
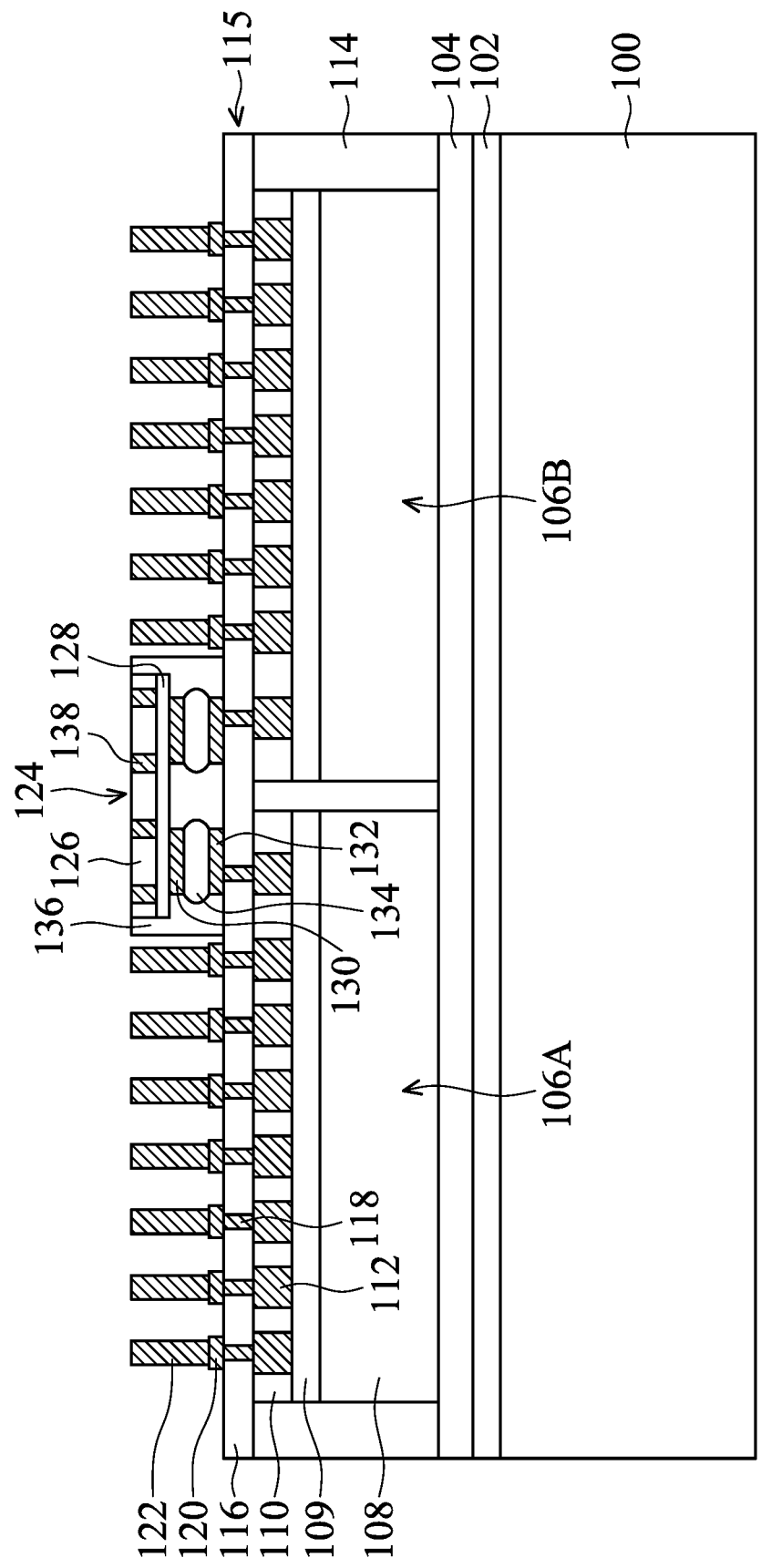

As shown in FIG. 1E, a semiconductor die 124 is disposed over the redistribution structure 105, in accordance with some embodiments. In some embodiments, the front side of the semiconductor die 124 faces the redistribution structure 105 with the back side of the semiconductor die 124 facing upwards. The semiconductor die 124 may be disposed using a pick and place operation.

The semiconductor die 124 may include a semiconductor substrate 126, an interconnection structure 128, and conductive pads 130 at the front side of the semiconductor die. In some embodiments, various device elements are formed in and/or on the semiconductor substrate 126. Examples of the various device elements include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc.), diodes, or other suitable elements.

The device elements are interconnected to form integrated circuit devices through conductive features formed in the interconnection structure 128. The interconnection structure 128 may include multiple dielectric layers and multiple conductive features. The conductive features may include multiple conductive lines, conductive contacts, and conductive vias. The integrated circuit devices include logic devices, memory devices (e.g., static random access memories, SRAMs), radio frequency (RF) devices, input/output (I/O) devices, system-on-chip (SoC) devices, one or more other applicable types of devices, or a combination thereof. In some embodiments, the semiconductor die 124 is a system-on-chip (SoC) chip that includes multiple functions.

However, embodiments of the disclosure are not limited thereto. Many variations and/or modifications can be made to embodiments of the disclosure. In some other embodiments, the semiconductor die 124 functions as an interconnection die for forming electrical connections between device elements in the semiconductor dies 106A and 106B. In some embodiments, no device element is formed in the semiconductor die 124. In some embodiments, the semiconductor die 124 includes through substrate vias 138. The through substrate vias 138 may penetrate through the semiconductor substrate 126 and be electrically connected to one or more of the conductive features in the interconnection structure 128.

The conductive pads 130 may be wider portions of some of the conductive lines formed on the interconnection structure 128. Some of the conductive pads 130 may be electrically connected to one or more device elements through some of the conductive features in the interconnection structure 128. Alternatively, some of the conductive pads 130 may be electrically connected to the through substrate vias 138 through some of the conductive features in the interconnection structure 128. Therefore, the device elements in and/or on the semiconductor substrate 126 may be electrically connected to other elements through the conductive pads 130.

In some embodiments, the conductive pads 130 of the semiconductor die 124 is bonded to the conductive pads 132 through conductive bumps 134, as shown in FIG. 1E. In some embodiments, the conductive bumps 134 are tin-containing solder bumps. The tin-containing solder bumps may further include copper, silver, gold, aluminum, lead, one or more other suitable materials, or a combination thereof. In some other embodiments, the conductive bumps 134 are lead-free. In some embodiments, an underfill element 136 is formed to surround and protect bonding structures including the conductive bumps 134 and the conductive pads 130 and 132, as shown in FIG. 1E.

Figure 1F:
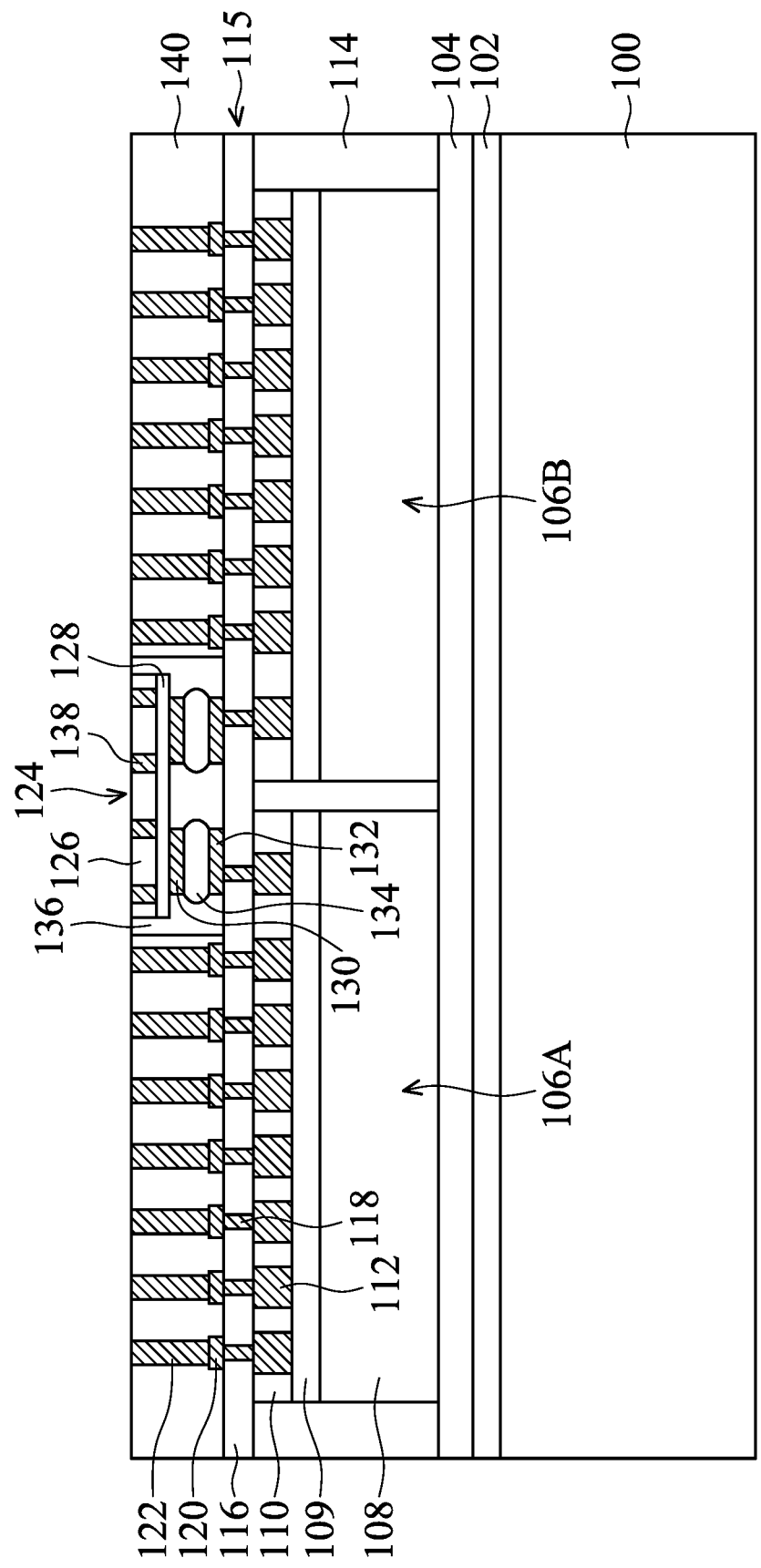

As shown in FIG. 1F, a protective layer 140 is formed over the redistribution structure 105 to surround and protect the semiconductor die 124 and the conductive structures 122, in accordance with some embodiments. In some embodiments, the top surfaces of the protective layer 140, the conductive structures 122, and the through substrate vias 138 of the semiconductor die 124 are substantially level with each other. The material and formation method of the protective layer 140 may be the same as or similar to those of the protective layer 114.

Figure 1G:
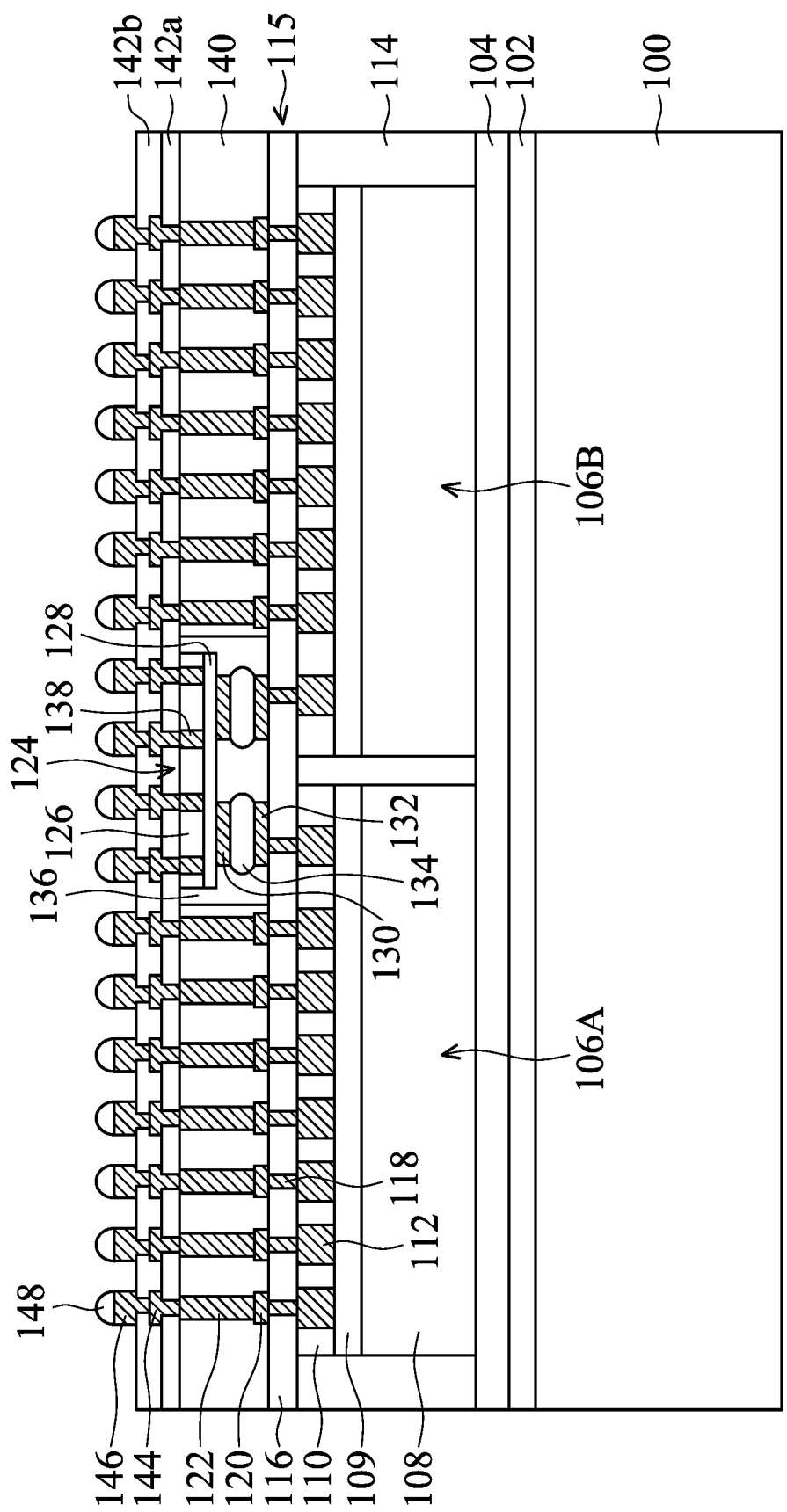

As shown in FIG. 1G, insulating layers 142*a* and 142*b*, conductive layers 144, and conductive pillars 146 are formed over the structure shown in FIG. 1F, in accordance with some embodiments.

FIGS. 2A-2I are cross-sectional views of various stages of a process for forming a package structure, in accordance with some embodiments. In some embodiments, FIGS. 2A-2I are enlarged cross-sectional views showing the formation of the insulating layers 142*a* and 142*b*, one of the conductive layers 144, and one of the conductive pillars 146 that are illustrated in FIG. 1G.

As shown in FIGS. 1G and/or 2A, an insulating layer 142*a* is formed over the protective layer 140, the conductive structures 122, and the semiconductor die 124, in accordance with some embodiments. The insulating layer 142*a* may be made of or include one or more polymer materials. The polymer material(s) may include polyimide (PI), poly-benzoxazole (PBO), epoxy-based resin, one or more other suitable polymer materials, or a combination thereof. The insulating layer 142*a* may be formed using a spin coating process, a spray coating process, one or more other applicable processes, or a combination thereof.

Figure 2A:
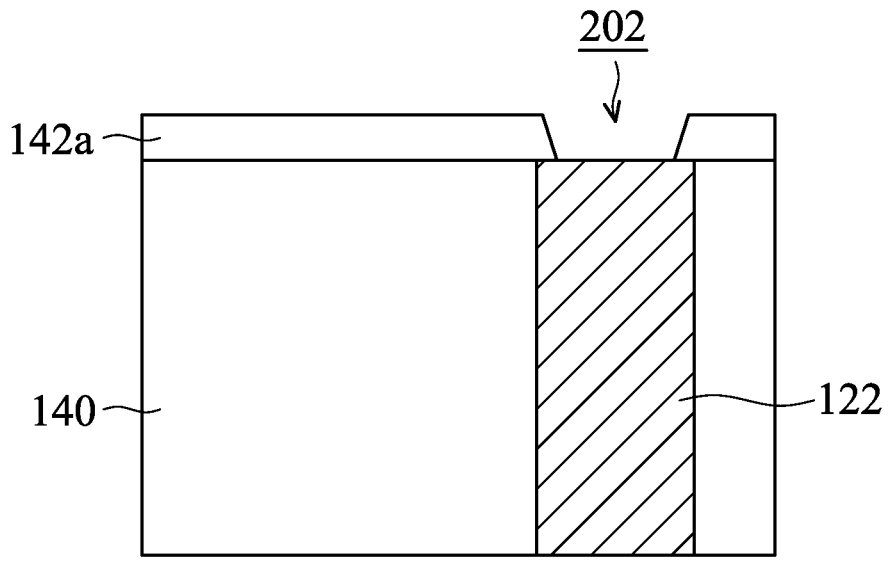
FIGS. 2A-2I are cross-sectional views of various stages of a process for forming a package structure, in accordance with some embodiments.

In some embodiments, the polymer material is photosensitive. A photolithography process may therefore be used to form openings with desired patterns in the insulating layers. As shown in FIG. 2A, an opening 202 is formed in the insulating layer 142*a* to expose one of the conductive structures 122, in accordance with some embodiments. The opening 202 may be formed using a photolithography process. In some embodiments, the width of the opening 202 is greater than about 25 µm.

Figure 2B:
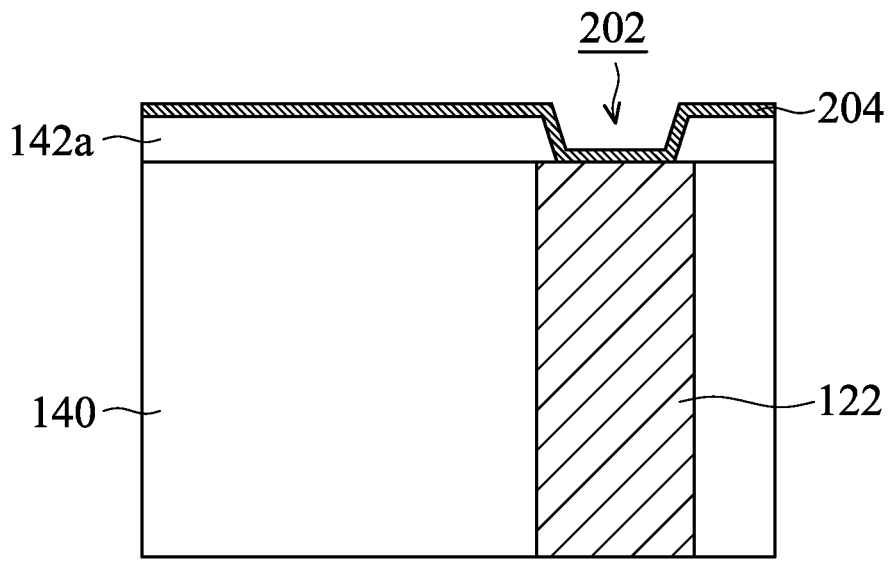

Afterwards, the conductive layers 144 are formed. FIGS. 2B-2E and 1G illustrate the formation of one of the conductive layers 144, in accordance with some embodiments. As shown in FIG. 2B, a seed layer 204 is deposited over the insulating layer 142*a* and the conductive structure 122, in accordance with some embodiments. The seed layer 204 extends over the sidewalls and bottom of the opening 202. In some embodiments, the seed layer 204 extends over the sidewalls and bottom of the opening 202 in a substantially conformal manner.

The seed layer 204 may be made of or include a metal material. The seed layer 204 may be made of or include Ti, Ti alloy, Cu, Cu alloy, one or more other suitable materials, or a combination thereof. The Ti alloy or the Cu alloy may further contain silver, chromium, nickel, tin, gold, tungsten, one or more other suitable elements, or a combination thereof. In some embodiments, the seed layer 204 is a single layer. In some other embodiments, the seed layer 204 includes multiple sub-layers. The seed layer 204 may be deposited using a physical vapor deposition (PVD) process, a chemical vapor deposition (CVD) process, a spin coating process, an atomic layer deposition (ALD) process, one or more other applicable processes, or a combination thereof.

Figure 2C:
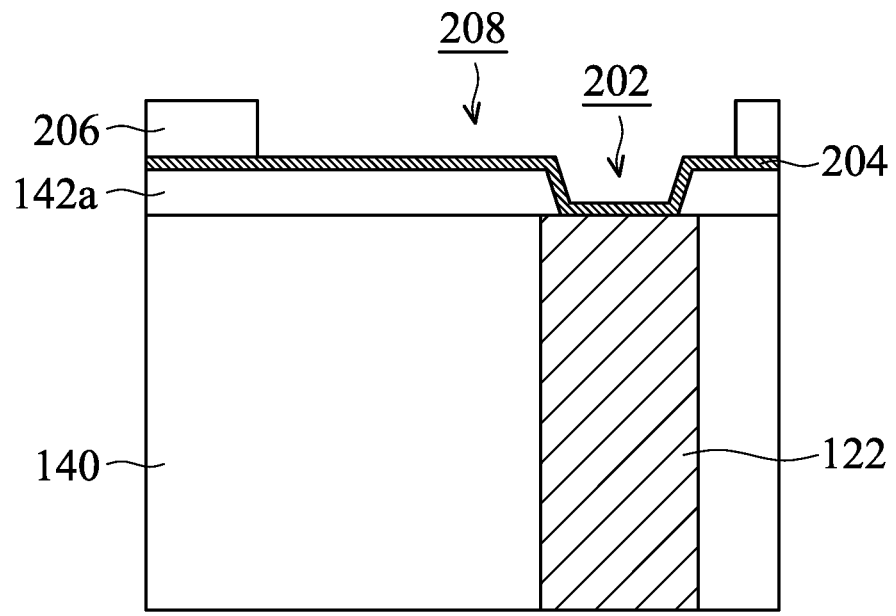

As shown in FIG. 2C, a mask element 206 is formed over the seed layer 204, in accordance with some embodiments. The mask element 206 has an opening 208 that exposes a portion of the seed layer 204 on which a conductive layer will be formed. In some embodiments, the mask element 206 is a photosensitive layer. The mask element 206 may be made of or include a photoresist material. The opening 208 of the mask element 206 may be formed using a photolithography process that includes an exposure operation and a development operation.

Figure 2D:
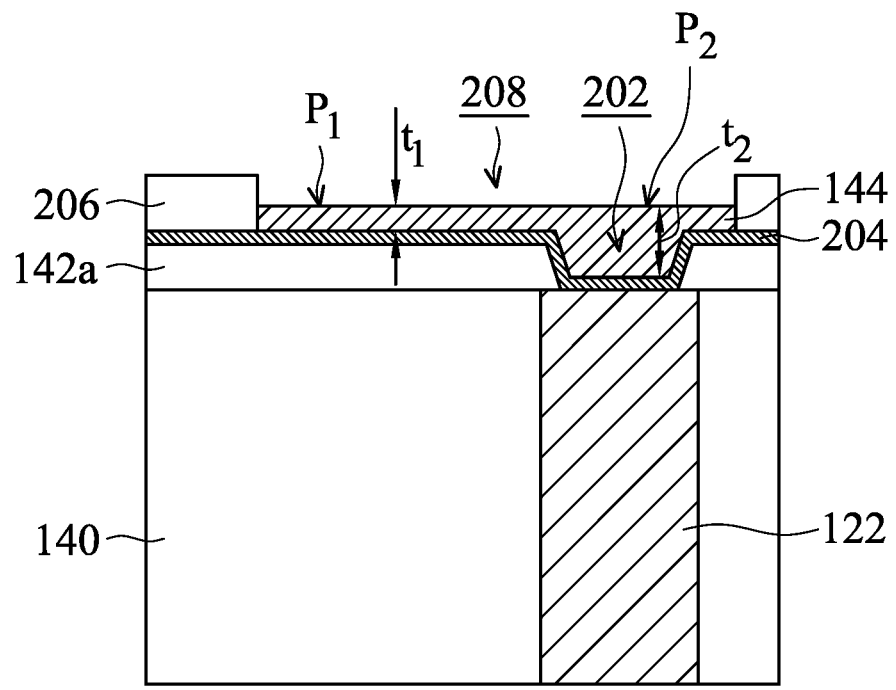

As shown in FIG. 2D, a conductive layer 144 is deposited over the portion of the seed layer 204 exposed in the opening 208, in accordance with some embodiments. In some embodiments, the conductive layer 144 "overfills" the opening 202 of the insulating layer 142*a*. In some embodiments, the conductive layer 144 has a first portion $P_1$ and a second portion $P_2$. The second portion $P_2$ overlays the opening 202. In some embodiments, the second portion $P_2$ fully overlays the opening 202 and has a second thickness t2. The first portion $P_1$ extends over the portion of the seed layer 204 that overlays the insulating layer 142*a*. The first portion $P_1$ has a first thickness t1. The first thickness t1 may be in a range from about 2 µm to about 7 µm. The ratio (t2/t1) of the second thickness t2 to the first thickness t1 may be in a range from about 1.5 to about 3. As shown in FIG. 2D, the second portion $P_2$ with the second thickness t2 is thicker than the first portion $P_1$ with the first thickness t1. In this way, the conductive layer 144 may present a substantially planar top surface 144s, as shown in FIG. 2D. In some embodiments, the entire top surface of the conductive layer 144 is substantially planar.

The conductive layer 144 may be made of or include copper, cobalt, tin, titanium, gold, nickel, platinum, one or more other suitable materials, or a combination thereof. In some embodiments, the conductive layer 144 is deposited using a bottom-up deposition process. That is, a conductive material used for forming the lower portion of the conductive layer 144 is selectively deposited or grown on the surface of the seed layer 204, and a further conductive material for forming the upper portion of the conductive layer 144 is selectively deposited or grown on the conductive material that has been deposited or grown. The bottom-up deposition process may be an electrochemical process. The bottom-up deposition process may include an electroplating process, an electroless plating process, one or more other applicable processes, or a combination thereof. In some other embodiments, the bottom-up deposition process is an atomic layer deposition (ALD) process.

In some embodiments, the conductive layer 144 is made of copper and is deposited using an electroplating process. An electroplating solution used for plating copper may contain copper sulfate ($CuSO_4$) and sulphuric acid ($H_2SO_4$). The sulphuric acid disassociates the copper ions from the copper sulfate, allowing the copper sulfate to migrate to the surface of the seed layer 204 and form the conductive layer 144.

The electroplating solution may further include additives such as accelerators, levelers, and suppressors. Organic compounds, which can be an example of the additives, are added to an electroplating bath acting as levelers to increase uniformity of metal deposition on different regions of the seed layer 204. These regions include the portion of the seed layer 204 extending over the sidewalls and bottom of the opening 202 and the portion of the seed layer 204 outside of the opening 202. The levelers may be nitrogen-containing molecules. Organic compound such polyethylene glycol (PEG) or, alternatively, polyalkylene glycol (PAG) may function as suppressors, while organic sulfides such as Bis(3-sulfopropyl)-disodium-sulfonate ($C_6H_{12}Na_2O_6S_4$) (SPS) may work as accelerators. The suppressor may be used for suppressing plating on the sidewalls in the opening 202. The accelerator may be used for accelerating deposition at the bottom in the opening 202.

In some embodiments, a greater amount of levelers are used during the electrochemical plating of the conductive layer 144. Therefore, the conductive layer 144 may present a substantially planar top surface, or a substantially planar top surface overlaying at least the opening 202. The substantially planar top surface extends across edges of the opening 202, as shown in FIG. 2D. The reliability of the conductive layer 144 can be improved, which shall be discussed as follows.

In certain cases where the width of the opening 202 is greater than about 25 μm, if the amount of levelers is not sufficient, the conductive layer may be deposited in a conformal manner. The conductive layer may not be able to overfill the opening 202 especially when the width of the opening 202 is greater than about 25 μm. As a result, a recess may be formed at a portion of the conductive layer directly above the conductive structure 122. The recess might become a weak point during subsequent thermal compression processes, such as a bonding process to a circuit board. The conductive layer might crack at the weak point, which negatively affects the performance and reliability of the package structure.

In contrary, in some embodiments where the conductive layer 144 is formed to have a substantially planar top surface, no weak point (such as a recess or a concave profile) is formed. The conductive layer 144 is capable of sustaining the stress caused by the subsequent thermal compression processes. The performance and reliability of the package structure are improved.

Figure 2E:
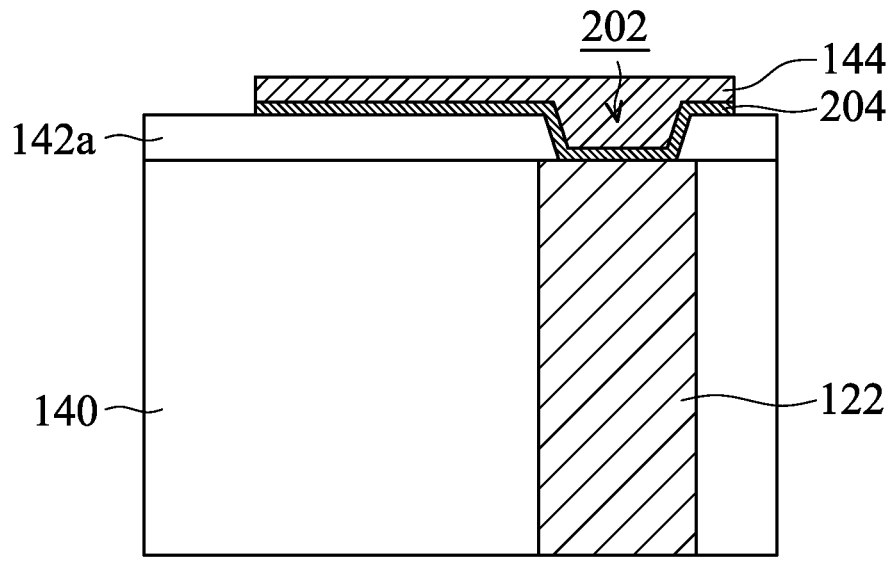

As shown in FIG. 2E, the mask element 206 is removed, in accordance with some embodiments. A stripping operation and/or an ashing operation may be used to remove the mask element 206.

Afterwards, the portions of the seed layer 204 not covered by the conductive layer 144 are removed to expose the insulating layer 142a, as shown in FIG. 2E in accordance with some embodiments. An etching process (such as a wet etching process) may be used to partially remove the seed layer 204, so as to expose the insulating layer 142a. A Surface portion of the conductive layer 144 may also be slightly etched during the etching process.

Figure 2F:
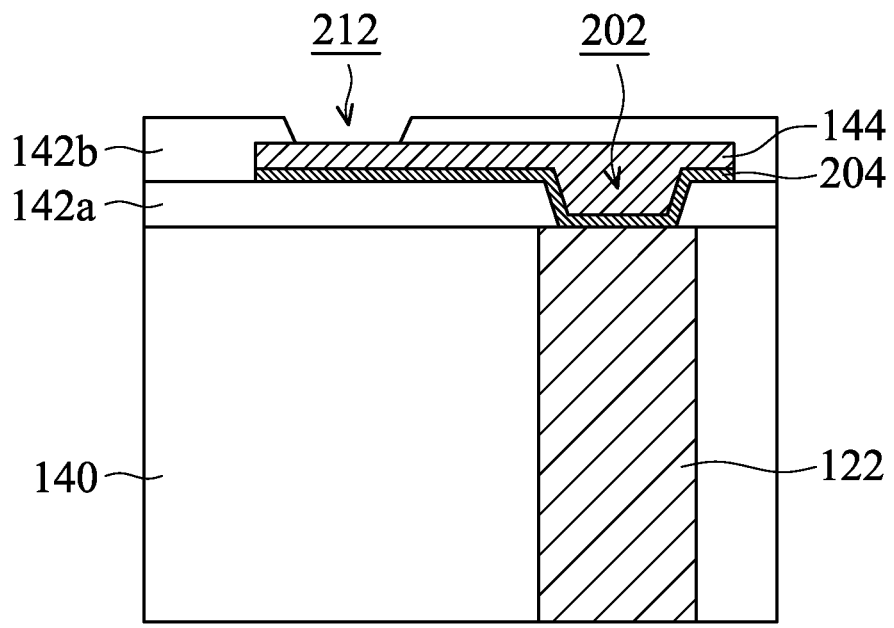

FIGS. 2F-2I and 1G illustrate the formation of the insulating layer 142b and one of the conductive pillars 146, in accordance with some embodiments. As shown in FIG. 2F, an insulating layer 142b is formed over the insulating layer 142a and the conductive layer 144, in accordance with some embodiments. The insulating layer 142b may be made of or include one or more polymer materials. The polymer material(s) may include polyimide (PI), polybenzoxazole (PBO), epoxy-based resin, one or more other suitable polymer materials, or a combination thereof. The insulating layer 142b may be formed using a spin coating process, a spray coating process, one or more other applicable processes, or a combination thereof.

In some embodiments, the polymer material is photosensitive. A photolithography process may therefore be used to form openings with desired patterns in the insulating layers. As shown in FIG. 2F, an opening 212 is formed in the insulating layer 142b to expose a portion of the conductive layer 144, in accordance with some embodiments. The opening 212 may be formed using a photolithography process. In some embodiments, the opening 212 is misaligned with the opening 202. The openings 212 and 202 are laterally spaced apart from each other without overlapping each other in the vertical direction, as shown in FIG. 2F in accordance with some embodiments.

Figure 2G:
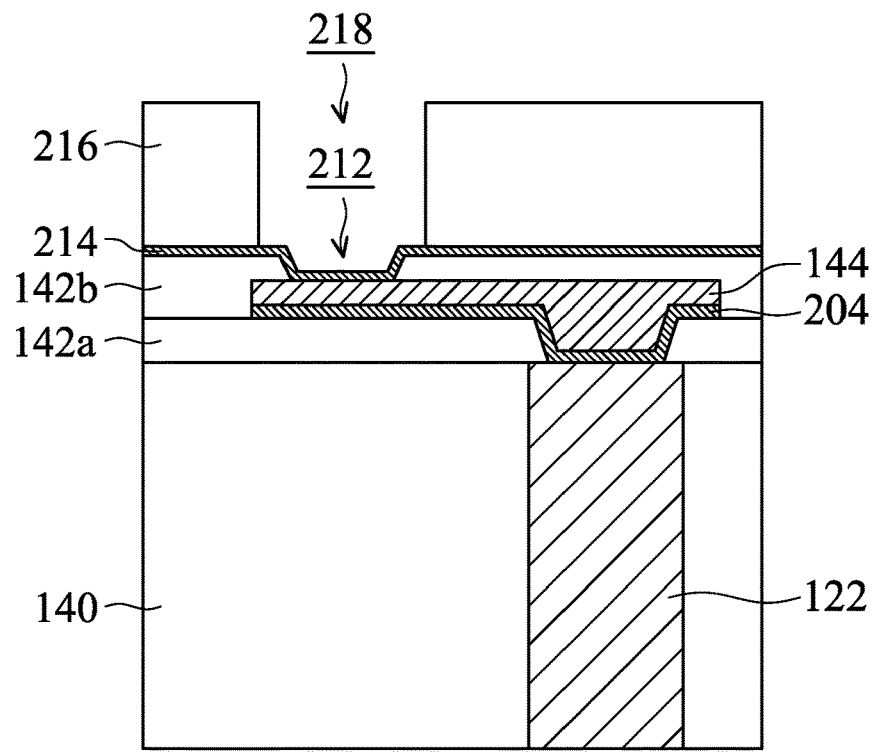

As shown in FIG. 2G, a seed layer 214 is deposited over the insulating layer 142b and the conductive layer 144, in accordance with some embodiments. The seed layer 214 extends over the sidewalls and bottom of the opening 212. In some embodiments, the seed layer 214 extends over the sidewalls and bottom of the opening 212 in a substantially conformal manner.

The seed layer 214 may be made of or include a metal material. The seed layer 214 may be made of or include Ti, Ti alloy, Cu, Cu alloy, one or more other suitable materials, or a combination thereof. The Ti alloy or the Cu alloy may further contain silver, chromium, nickel, tin, gold, tungsten, one or more other suitable elements, or a combination thereof. In some embodiments, the seed layer 214 is a single layer. In some other embodiments, the seed layer 214 includes multiple sub-layers. The seed layer 214 may be deposited using a physical vapor deposition (PVD) process, a chemical vapor deposition (CVD) process, a spin coating process, an atomic layer deposition (ALD) process, one or more other applicable processes, or a combination thereof.

Afterwards, a mask element 216 is formed over the seed layer 214, as shown in FIG. 2G in accordance with some embodiments. The mask element 216 has an opening 218 that exposes a portion of the seed layer 214 on which a conductive pillar will be formed. In some embodiments, the mask element 216 is a photosensitive layer. The mask element 216 may be made of or include a photoresist material. The opening 218 of the mask element 216 may be formed using a photolithography process that includes an exposure operation and a development operation.

Figure 2H:
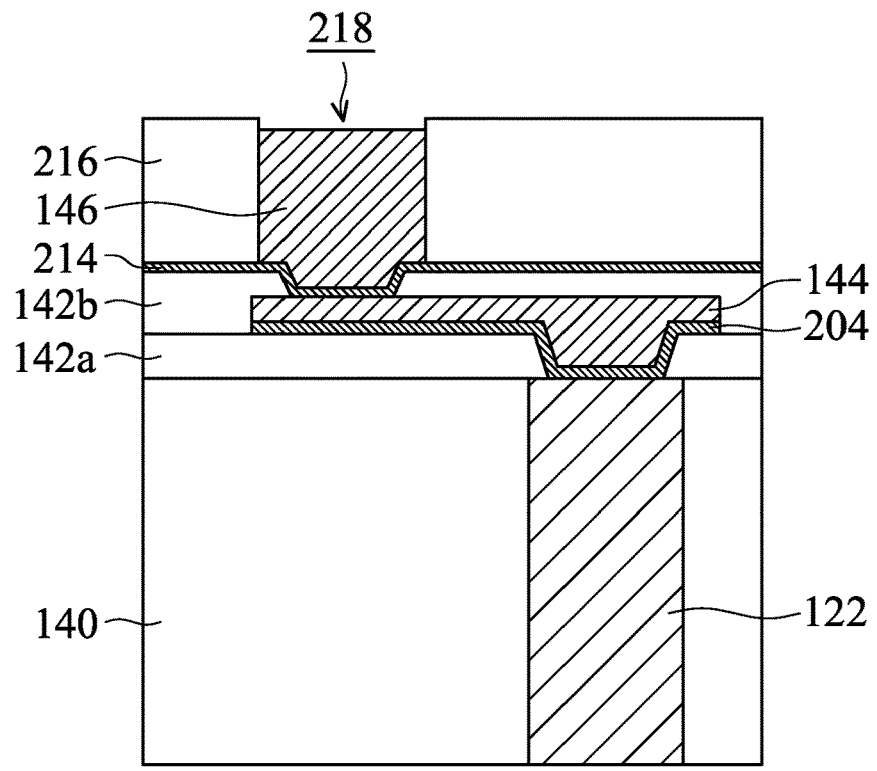

As shown in FIG. 2H, a conductive pillar 146 is formed in the opening 218, in accordance with some embodiments. The conductive pillar 146 may be made of or include copper, cobalt, tin, titanium, gold, one or more other suitable materials, or a combination thereof. The conductive pillar 146 may be formed using an electroplating process, an electroless plating process, one or more other applicable processes, or a combination thereof. A conductive material is plated on the exposed portions of the seed layer 214 so as to form the conductive pillar 146 that is electrically connected to the conductive layer 144.

Figure 2I:
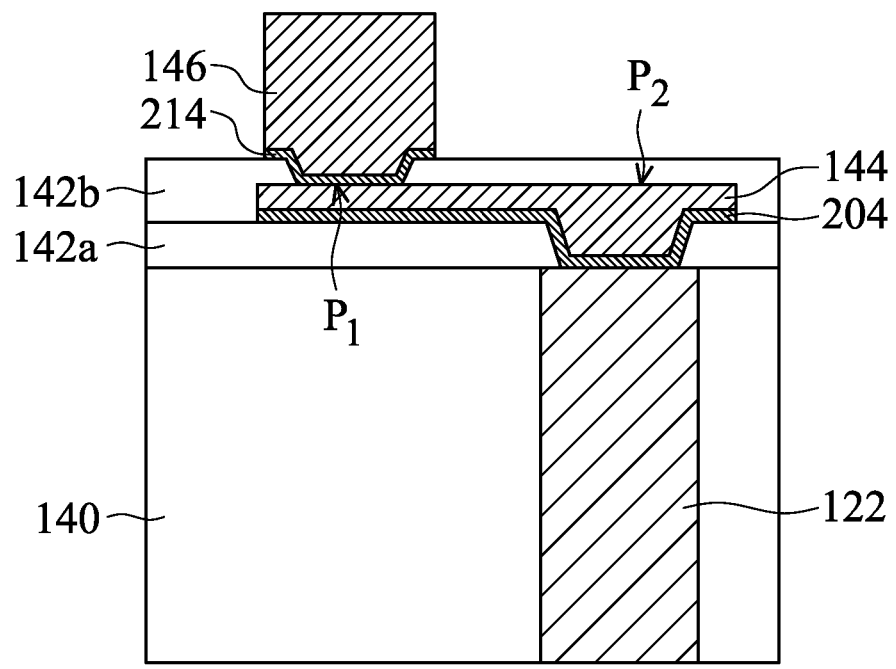

As shown in FIG. 2I, the mask element 216 is removed, in accordance with some embodiments. A stripping operation and/or an ashing operation may be used to remove the mask element 216.

Afterwards, the portions of the seed layer 214 not covered by the conductive pillar 146 are removed to expose the insulating layer 142b, as shown in FIG. 2I in accordance with some embodiments. An etching process (such as a wet etching process) may be used to partially remove the seed layer 204, so as to expose the insulating layer 142b. A Surface portion of the conductive pillar 146 may also be slightly etched during the etching process. The seed layer 214 and the conductive pillar 146, that are remaining, together act as a conductive pillar that extends into the insulating layer 142b to be in electrical contact with the conductive layer 144.

In some embodiments, the insulating layer 142b surrounds a lower portion of the conductive pillar 146. However, many variations and/or modifications can be made to embodiments of the disclosure. In some other embodiments, an entirety of the conductive pillar 146 is positioned above the top surface of the insulating layer 142b.

In some embodiments, the conductive pillar 146 and the conductive structure 122 are laterally spaced apart from each other, as shown in FIG. 2I. In some embodiments, the conductive pillar 146 and the conductive structure 122 are misaligned with each other. In some embodiments, the conductive pillar 146 and the conductive structure 122 do not overlap each other in the vertical extending direction of the conductive pillar 146.

Referring back to FIG. 1G, conductive bumps 148 are formed over the conductive pillars 146, in accordance with some embodiments. In some embodiments, the conductive bumps 148 are solder bumps. In some embodiments, the conductive bumps 148 include ball grid array (BGA) connectors, solder balls, controlled collapse chip connection (C4) bumps, micro bumps, electroless nickel-electroless palladium-immersion gold technique (ENEPIG) formed bumps, one or more other suitable connectors, or a combination thereof. In some embodiments, the conductive bumps 148 are tin-containing solder bumps. The tin-containing solder bumps may further include copper, silver, gold, aluminum, lead, one or more other suitable materials, or a combination thereof. In some other embodiments, the conductive bumps 148 are lead-free. The conductive bumps 148 may be formed using a solder ball placement process and a thermal reflow process.

Alternatively, a tin-containing material is applied on or electroplated on the conductive pillars 146. Afterwards, a thermal process is used to reflow the tin-containing material, so as to form the conductive bumps 148. In some embodiments, the tin-containing material is applied on or electroplated on the conductive pillars 146 before the mask element 216 shown in FIG. 2H is removed.

Figure 1H:
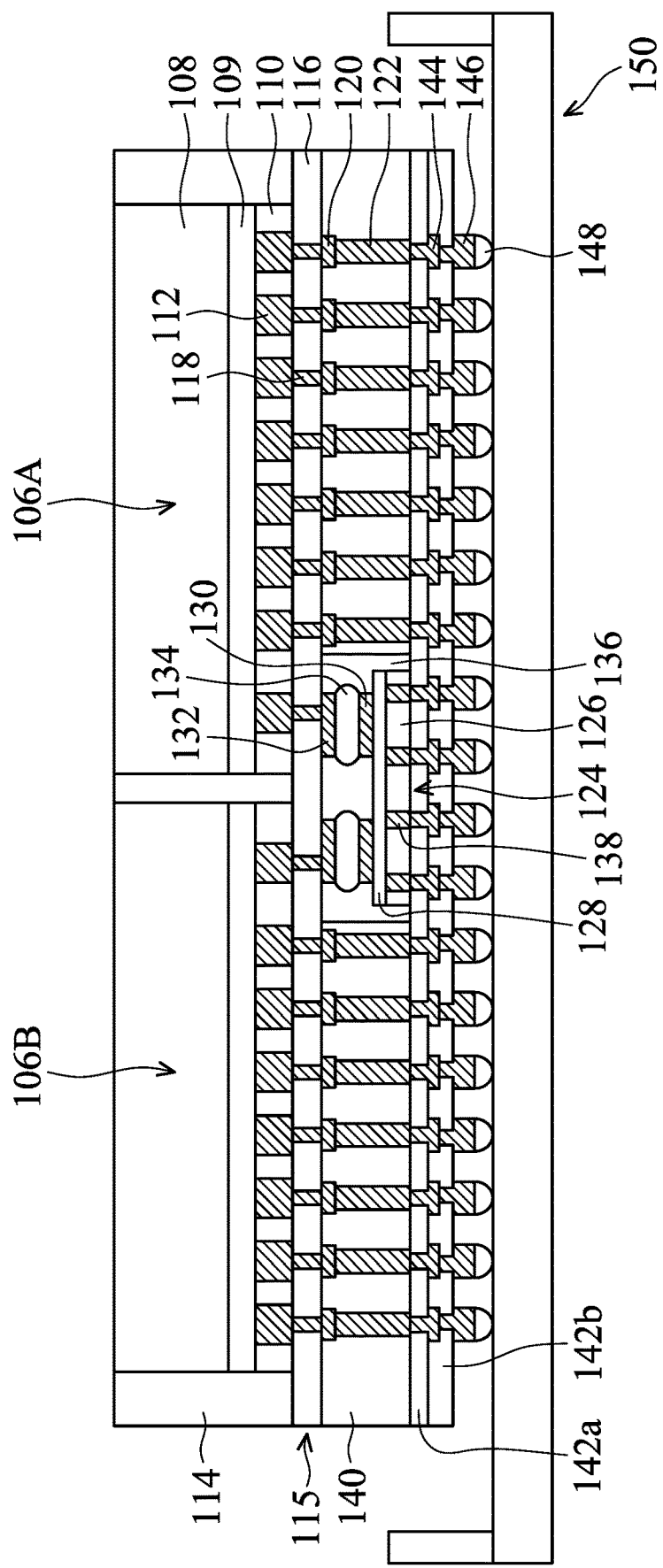

As shown in FIG. 1H, the structure shown in FIG. 1G is turned upside down and attached onto a tape carrier 150, in accordance with some embodiments. In some embodiments, the die-attach film 104, the adhesive layer 102, and the carrier substrate 100 are then removed.

Figure 1I:
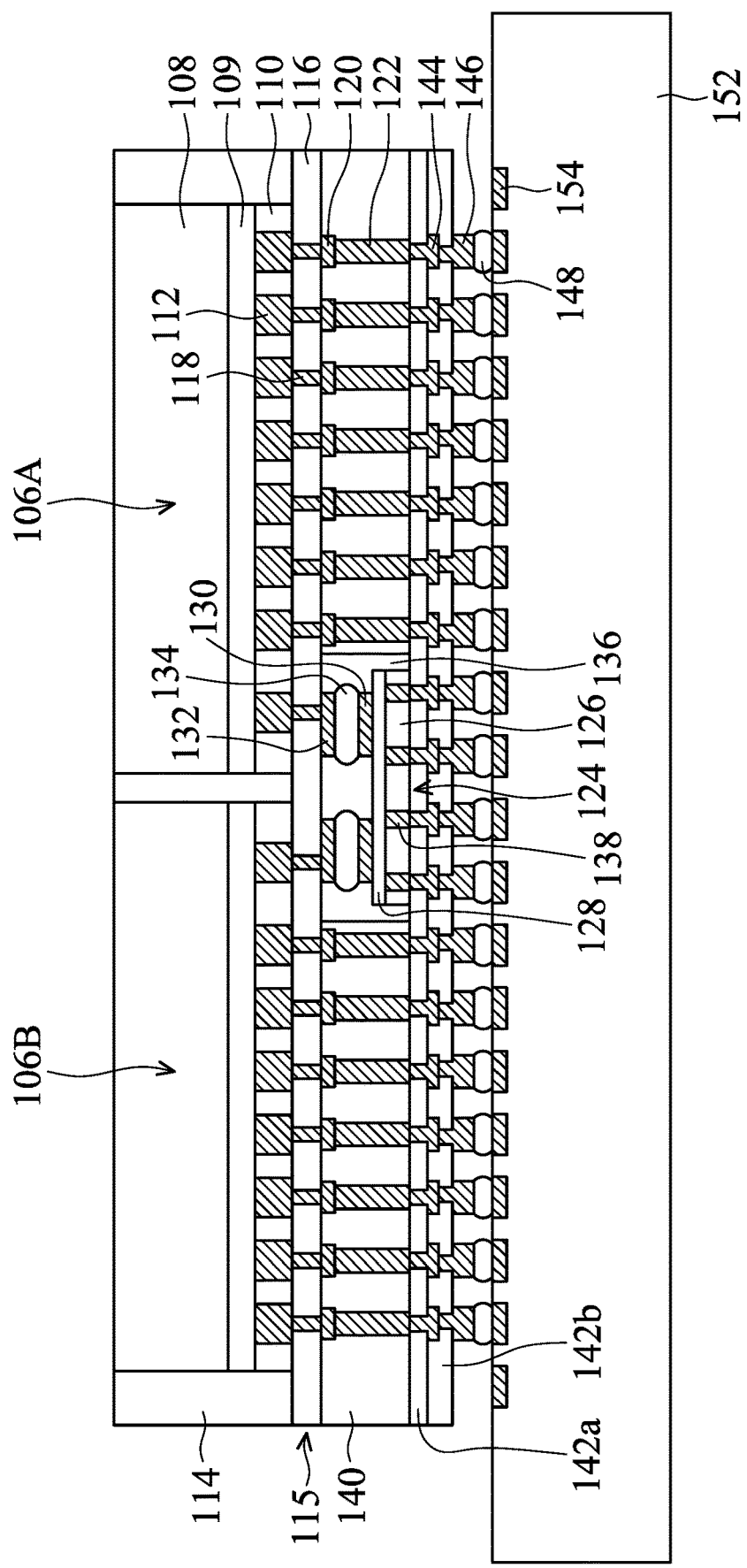

Afterwards, a sawing process may be used to cut through the structure shown in FIG. 1H into multiple separate package structures. In some embodiments, one of the package structures is picked and placed onto a circuit board 152, as shown in FIG. 1I in accordance with some embodiments. In some embodiments, the circuit board 152 is a printed circuit board. In some other embodiments, the circuit board 152 is an interposer substrate that may then be bonded onto another substrate. In some embodiments, the package structure is bonded to conductive pads 154 of the circuit board 152 through the conductive bump 148.

The bonding between the package structure and the circuit board 152 may involve a thermal compression process. In some embodiments, a compression force is applied to the package structure against the circuit board at an elevated temperature. In some embodiments, the elevated temperature is higher than about 120 degrees C. and lower than the melting point of the conductive bumps 148. In some embodiments, the elevated temperature is in a range from about 120 degrees C. to about 200 degrees C. In some other embodiments, the elevated temperature is in a range from about 150 degrees C. to about 180 degrees C. Stress caused by the bonding process may propagate to the conductive layer 144. Because the conductive layer 144 is formed to have a substantially planar top surface, no weak point (such as a recess or a concave profile) is formed. The conductive layer 144 is capable of sustaining the stress caused by the bonding process without being damaged. The performance and reliability of the package structure are improved.

As mentioned above, in some embodiments, the conductive layer 144 is formed to have a substantially planar top surface for enhancing the strength of the conductive layer 144. However, embodiments of the disclosure are not limited thereto. Many variations and/or modifications can be made to embodiments of the disclosure.

Figure 3:
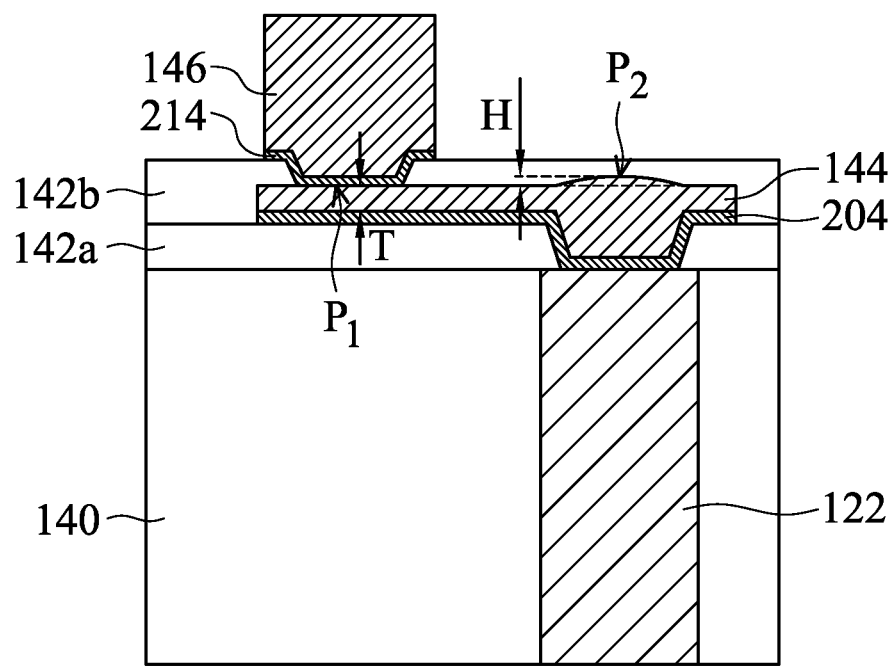
FIG. 3 is a cross-sectional view of a package structure, in accordance with some embodiments.

FIG. 3 is a cross-sectional view of a package structure, in accordance with some embodiments. A structure similar to that shown in FIG. 2I is formed. As shown in FIG. 3, the conductive layer 144 has a first portion $P_1$ and a second portion $P_2$. The first portion $P_1$ is directly below the conductive pillar 146, and the second portion $P_2$ is directly above the conductive structure 122. In some embodiments, the top of the second portion $P_2$ is higher than the top of the first portion $P_1$.

In some embodiments, the second portion $P_2$ of the conductive layer 144 has a protruding surface. The protruding surface may be a curved surface. In some embodiments, the protruding surface is a convex surface facing upwards. By fine-tuning the electrochemical plating process for forming the conductive layer 144, the second portion $P_2$ may be formed to have the profile mentioned above to enhance the strength of the second portion $P_2$ of the conductive layer 144. The anti-crack ability of the conductive layer 144 may be improved.

As shown in FIG. 3, the top of the second portion $P_2$ is positioned at a height level that is higher than the height level of the first portion $P_1$ (indicated by the dotted line) by a height difference H. In some embodiments, the height difference H is in a range from about 0.1 µm to about 2 µm. The first portion $P_1$ has a thickness T. The thickness T may be in a range from about 2 µm to about 7 µm. In some embodiments, the ratio of the height difference H to the thickness T (H/T) is in a range from about 0.1 to about 0.5.

Many variations and/or modifications can be made to embodiments of the disclosure. In some other embodiments, there is no height difference between the height levels of the first portion $P_1$ and the second portion $P_2$. In these cases, the conductive layer 144 may have a substantially planar top surface. The ratio of the height difference H to the thickness T (H/T) is substantially equal to zero.

Embodiments of the disclosure form a package structure including a conductive structure (such as a through vias surrounded by a protective layer) and a conductive pillar. The package structure also includes a conductive layer that forms electrical connection between the conductive structure and the conductive pillar. By fine-tuning a bottom-up deposition process for forming the conductive layer, the portion of the conductive layer directly above the conductive structure is formed to have a substantially planar top surface or a protruding surface. Because the conductive layer is formed to have the profile mentioned above, no weak point (such as a recess) is formed. The anti-crack ability of the conductive layer is thus improved. The conductive layer is capable of sustaining the stress caused by subsequent processes such as the bonding process. The performance and reliability of the package structure are improved.

In accordance with some embodiments, a method for forming a package structure is provided. The method includes forming a conductive structure over a carrier substrate and disposing a semiconductor die over the carrier substrate. The method also includes forming a protective layer to surround the conductive structure and the semiconductor die. The method further includes forming an insulating layer over the protective layer. The insulating layer has an opening exposing a portion of the conductive structure. A width of the opening is greater than about 25 µm. In addition, the method includes forming a conductive layer over the insulating layer. The conductive layer overfills the opening, and the conductive layer has a substantially planar top surface. A portion of the conductive layer extends across a sidewall of the conductive structure.

In accordance with some embodiments, a method for forming a package structure is provided. The method includes forming a protective layer to surround a conductive structure and a semiconductor die. The method also includes forming a first insulating layer over the protective layer. The first insulating layer has a first opening exposing a portion of the conductive structure. The method further includes forming a conductive layer over the first insulating layer to overfill the first opening using a bottom-up deposition process. A portion of the conductive layer extends outside of the opening and extends across a sidewall of the conductive structure. In addition, the method includes forming a second insulating layer over the conductive layer. The second insulating layer has a second opening exposing a portion of the conductive layer. The method further includes forming a conductive pillar over the portion of the conductive layer exposed by the second opening.

In accordance with some embodiments, a package structure is provided. The package structure includes a conductive structure and a semiconductor die laterally separated from each other. The package structure also includes a protective layer surrounding the conductive structure and the semiconductor die. The package structure further includes an insulating layer over the protective layer. In addition, the package structure includes a conductive layer over the insulating layer and electrically connected to the conductive structure. The conductive layer has a substantially planar top surface. A portion of the conductive layer embedded in the insulating layer has a width greater than about 25 µm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a first protective layer surrounding a first semiconductor die and a second semiconductor die;
    a redistribution structure over the first protective layer, the first semiconductor die and the second semiconductor die, wherein the redistribution structure has a first conductive via and a second conductive via, and the redistribution structure has an insulating layer surrounding the first conductive via and the second conductive via;
    a conductive structure and a third semiconductor die laterally separated from each other, wherein the third semiconductor die extends across edges of the first semiconductor die and the second semiconductor die, the third semiconductor die is bonded to the redistribution structure through a plurality of tin-containing solder bumps, the first conductive via is aligned with a first conductive pad of the first semiconductor die and a first tin-containing solder bump of the tin-containing solder bumps, and the second conductive via is aligned with a second conductive pad of the second semiconductor die and a second tin-containing solder bump of the tin-containing solder bumps, wherein the first semiconductor die has a first passivation layer surrounding the first conductive pad, the second semiconductor die has a second passivation layer surrounding the second conductive pad, and the insulating layer of the redistribution structure is in direct contact with the first passivation layer, the second passivation layer, the first conductive pad, and the second conductive pad;
    a second protective layer surrounding the conductive structure and the third semiconductor die;
    a through substrate via in a semiconductor substrate of the third semiconductor die, wherein ends of the through substrate via and the conductive structure are level with each other;
    an insulating layer over the second protective layer; and
    a conductive layer over the insulating layer and electrically connected to the conductive structure, wherein the conductive layer has a first portion laterally spaced from the conductive structure and a second portion directly above the conductive structure, a top of the first portion is closer to the second protective layer than a top of the second portion, and the second portion is thicker than the insulating layer.

2. The package structure as claimed in claim 1, further comprising:

a second insulating layer over the insulating layer and the conductive layer, wherein the second insulating layer is in direct contact with the second portion of the conductive layer.

3. The package structure as claimed in claim 1, wherein a lower part of the second portion of the conductive layer is embedded in the insulating layer, the lower part of the second portion has a width greater than about 25 μm, and opposite sidewalls of the lower part of the second portion are laterally between exterior sidewalls of the insulating layer.

4. The package structure as claimed in claim 1, wherein the second portion of the conductive layer has a convex surface.

5. The package structure as claimed in claim 1, further comprising:
an underfill element surrounding the third semiconductor die, wherein the third semiconductor die is separated from the second protective layer by the underfill element, and the underfill element is in direct contact with the redistribution structure.

6. The package structure as claimed in claim 1, wherein edges of the first protective layer, the redistribution structure, and the second protective layer are aligned with each another.

7. The package structure as claimed in claim 1, wherein each of the first semiconductor die and the second semiconductor die is wider than the third semiconductor die.

8. The package structure as claimed in claim 1, further comprising:
a circuit board, and
a plurality of bonding structures between the circuit board and the insulating layer.

9. The package structure as claimed in claim 1, wherein a portion of the first protective layer is between the first semiconductor die and the second semiconductor die.

10. The package structure as claimed in claim 1, further comprising:
a second insulating layer covering and laterally surrounding the second portion of the conductive layer.

11. A package structure, comprising:
a first semiconductor die and a second semiconductor die spaced apart from each other, wherein the first semiconductor die has a first conductive pad and a first passivation layer surrounding the first conductive pad, and the second semiconductor die has a second conductive pad and a second passivation layer surrounding the second conductive pad;
a first protective layer laterally surrounding the first semiconductor die and the second semiconductor die;
a conductive structure and a third semiconductor die spaced apart from each other, wherein the third semiconductor die extends across edges of the first semiconductor die and the second semiconductor die, a third conductive pad of the third semiconductor die is aligned with the first conductive pad of the first semiconductor die, and a fourth conductive pad of the third semiconductor die is aligned with the second conductive pad of the second semiconductor die;
a second protective layer laterally surrounding the conductive structure and the third semiconductor die;
a redistribution structure between the first protective layer and the second protective layer, wherein the redistribution structure has a plurality of conductive vias and an insulating layer surrounding the conductive vias, and a first interface between the insulating layer and the first passivation layer is level with a second interface between the insulating layer and the first conductive pad;
an insulating layer extending across an interface between the second protective layer and the conductive structure, wherein the insulating layer is in direct contact with a semiconductor substrate of the third semiconductor die; and
a conductive layer over the insulating layer and electrically connected to the conductive structure, wherein the conductive layer has a first portion laterally spaced from the conductive structure and a second portion directly above the conductive structure, a top of the first portion is closer to the second protective layer than a top of the second portion, and the second portion is thicker than the insulating layer.

12. The package structure as claimed in claim 11, further comprising:
a second insulating layer over the insulating layer and the conductive layer, wherein an interface between the second insulating layer and the second portion of the conductive layer is a curved surface.

13. The package structure as claimed in claim 11, wherein a lower part of the second portion of the conductive layer is embedded in the insulating layer, the lower part of the second portion has a width greater than about 25 μm, and opposite sidewalls of the lower part of the second portion are laterally between exterior sidewalls of the insulating layer.

14. The package structure as claimed in claim 11, wherein the redistribution structure extends across opposite edges of each of the first semiconductor die, the second semiconductor die, and the third semiconductor die, wherein the redistribution structure separates the first protective layer from the second protective layer.

15. The package structure as claimed in claim 14, wherein edges of the redistribution structure, the first protective layer, and the second protective layer are aligned with each other.

16. A package structure, comprising:
a first semiconductor die and a second semiconductor die laterally spaced apart from each other, wherein the first semiconductor die has a first conductive pad, and the second semiconductor die has a second conductive pad;
a conductive structure and a third semiconductor die laterally spaced apart from each other, wherein the third semiconductor die extends across a portion of the first semiconductor die and a portion of the second semiconductor die, a third conductive pad of the third semiconductor die is aligned with the first conductive pad of the first semiconductor die, and a fourth conductive pad of the third semiconductor die is aligned with the second conductive pad of the second semiconductor die;
a protective layer laterally surrounding the conductive structure and the third semiconductor die;
a redistribution structure extending across opposite edges of each of the first semiconductor die, the second semiconductor die, and the third semiconductor die, wherein the redistribution structure is between the first semiconductor die and the protective layer, and an insulating layer of the redistribution structure is in direct contact with the first conductive pad of the first semiconductor die and the second conductive pad of the second semiconductor die;
an insulating layer extending across an interface between the protective layer and the conductive structure, wherein a first interface between the insulating layer and the protective layer and a second interface between the insulating layer and a semiconductor substrate of the third semiconductor die are level with each other; and a conductive layer over the insulating layer and electrically connected to the conductive structure, wherein the conductive layer has a first portion laterally spaced from the conductive structure and a second portion directly above the conductive structure, tops of the first portion and the second portion are positioned at different height levels, and the second portion is thicker than the insulating layer.

17. The package structure as claimed in claim 16, wherein a lower part of the second portion of the conductive layer is embedded in the insulating layer, the lower part of the second portion has a width greater than about 25 µm, and opposite sidewalls of the lower part of the second portion are laterally between exterior sidewalls of the insulating layer.

18. The package structure as claimed in claim 16, wherein the redistribution structure has a first conductive via and a second conductive via, the first conductive via is aligned with the third conductive pad of the third semiconductor die and the first conductive pad of the first semiconductor die, and the second conductive via is aligned with the fourth conductive pad of the third semiconductor die and the second conductive pad of the second semiconductor die.

19. The package structure as claimed in claim 16, further comprising:

a second protective layer, wherein at least a portion of the second protective layer is between the first semiconductor die and the second semiconductor die.

20. The package structure as claimed in claim 16, wherein the insulating layer comprises a polymer material.

* * * * *